(12) United States Patent
Chen

(10) Patent No.: US 12,020,601 B2
(45) Date of Patent: Jun. 25, 2024

(54) FOLDABLE DISPLAY MODULE AND FOLDABLE DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Qi Chen, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 437 days.

(21) Appl. No.: 17/297,981

(22) PCT Filed: Mar. 31, 2021

(86) PCT No.: PCT/CN2021/084257
§ 371 (c)(1),
(2) Date: May 27, 2021

(87) PCT Pub. No.: WO2022/198698
PCT Pub. Date: Sep. 29, 2022

(65) Prior Publication Data
US 2023/0316956 A1   Oct. 5, 2023

(30) Foreign Application Priority Data

Mar. 24, 2021   (CN) .......................... 202110314720.5

(51) Int. Cl.
*G09F 9/30* (2006.01)
*B32B 7/023* (2019.01)
(Continued)

(52) U.S. Cl.
CPC .............. *G09F 9/301* (2013.01); *B32B 7/023* (2019.01); *G02B 1/111* (2013.01);
(Continued)

(58) Field of Classification Search
CPC ..... G09F 9/301; B32B 7/023; B32B 2250/05; B32B 2255/20; B32B 2457/206;
(Continued)

(56) References Cited

U.S. PATENT DOCUMENTS 9,733,397 B2 * 8/2017 Shibuya .................. G02B 1/111
2005/0175796 A1 * 8/2005 Nakamura ........... G02B 5/3033
                                                                    428/32.8
(Continued)

FOREIGN PATENT DOCUMENTS

CN        105353430 A     2/2016
CN        207503984 U     6/2018
(Continued)

*Primary Examiner* — Tom V Sheng
(74) *Attorney, Agent, or Firm* — PV IP PC; Wei Te Chung; Zhigang Ma

(57) ABSTRACT

The present application provides a foldable display module and a foldable display device. The foldable display module includes a flexible display panel and a first anti-reflection layer. The first anti-reflection layer is disposed on a light-emitting side of the flexible display panel. A side of the first anti-reflection layer away from the flexible display panel is provided with a coating layer with fluoride. In this way, intensity of light reflected by a surface of the foldable display module can be reduced, and an imaging effect of a crease on the surface of the foldable display module can be reduced, thereby reducing a visual feeling of a human eye on the crease.

18 Claims, 5 Drawing Sheets

(51) Int. Cl.
*G02B 1/111* (2015.01)
*G02B 1/11* (2015.01)
*G02B 1/14* (2015.01)
*G02F 1/1335* (2006.01)

(52) U.S. Cl.
CPC ....... *B32B 2250/05* (2013.01); *B32B 2255/20* (2013.01); *B32B 2457/206* (2013.01); *G02B 1/11* (2013.01); *G02B 1/14* (2015.01); *G02F 1/133502* (2013.01)

(58) Field of Classification Search
CPC .. G02B 1/11; G02B 1/14; G02B 1/111; G02F 1/133502
USPC .......................................................... 345/82
See application file for complete search history.

(56) References Cited

U.S. PATENT DOCUMENTS

| | | | | |
|---|---|---|---|---|
| 2006/0153979 | A1* | 7/2006 | Asakura | B32B 27/30 428/323 |
| 2007/0259161 | A1* | 11/2007 | Kato | G02B 1/14 428/447 |
| 2007/0285776 | A1* | 12/2007 | Nakamura | G02B 5/3083 359/586 |
| 2009/0009863 | A1* | 1/2009 | Nakamura | B29C 55/08 252/582 |
| 2009/0246415 | A1* | 10/2009 | Horie | G02B 1/11 977/773 |
| 2013/0084442 | A1* | 4/2013 | Akutagawa | B05D 3/108 524/265 |
| 2014/0065326 | A1* | 3/2014 | Lee | G09F 9/301 428/12 |
| 2016/0339678 | A1* | 11/2016 | Takegami | G02F 1/133502 |
| 2021/0255367 | A1* | 8/2021 | Kim | G06F 1/181 |
| 2021/0359277 | A1* | 11/2021 | Jung | G06F 1/1681 |
| 2022/0187503 | A1* | 6/2022 | Suzuki | G02B 5/3033 |
| 2023/0127573 | A1* | 4/2023 | Kobayashi | C23C 14/024 359/507 |

FOREIGN PATENT DOCUMENTS

| | | |
|---|---|---|
| CN | 208922659 U | 5/2019 |
| CN | 110473471 A | 11/2019 |
| CN | 110534022 A | 12/2019 |
| CN | 112444893 A | 3/2021 |

\* cited by examiner

FOLDABLE DISPLAY MODULE AND FOLDABLE DISPLAY DEVICE

RELATED APPLICATIONS

This application is a Notional Phase of PCT Patent Application No. PCT/CN2021/084257 having international filing date of Mar. 31, 2021, which claims the benefit of priority of Chinese Patent Application Nos. 202110314720.5 filed on Mar. 24, 2021. The contents of the above applications are all incorporated by reference as if fully set forth herein in their entirety.

FIELD OF INVENTION

The present application is related to the field of display technology and specifically to a foldable display module and a foldable display device.

BACKGROUND OF INVENTION

Organic light-emitting diode (OLED) display technology can independently emit light without a need for a backlight, so that an overall thickness of a stack structure of an OLED display module is greatly reduced, and its screen becomes easier to bend. With continuous breakthroughs in various OLED technologies, flexible displays have entered a stage of commercialization. In recent years, various terminal manufacturers have successively introduced foldable and curlable display electronic products. However, their high prices make product sales less than expected, and a foldable mobile phone commercial market has not been quickly released.

After a current foldable mobile phone has been bent many times or placed for a long time, an irreversible wrinkle will occur to a screen surface of the foldable mobile phone, which affects users' visual experiences. The wrinkle is a human eye's imaging perception of a crease in a middle of the foldable mobile phone. A main reason why the crease occurs is that a module material of the foldable mobile phone will undergo irreversible plastic deformation after being bent a certain number of times. A degree of light reflection in a plastically deformed region is different from a degree of light reflection in a non-plastically deformed region, which causes the human eye to clearly see the crease when a screen of the foldable mobile phone is not illuminated. At present, water contact angles of an anti-reflection film on the market are less than 105°, which is only achieved by attaching anti-reflection film materials on an outermost side of the screen of the foldable mobile phone to reduce wrinkle imaging. As a result, a hydrophobicity of the screen surface of the foldable mobile phone is not good, and fingerprints are easily left on the screen surface, thus limiting applications of the anti-reflection film materials in the foldable mobile phone.

In summary, there is a problem that the current foldable mobile phones are prone to have creases. Therefore, it is necessary to provide a foldable display module and a foldable display device to relieve this defect.

SUMMARY OF INVENTION

The present application provides a foldable display module and a foldable display device to solve a problem that current foldable mobile phones are prone to have creases.

An embodiment of the present application provides a foldable display module including:

a flexible display panel; and
a first anti-reflection layer disposed on a light-emitting side of the flexible display panel, wherein a side of the first anti-reflection layer away from the flexible display panel is provided with a coating layer with fluoride for increasing water contact angles of a surface the foldable display module.

According to an embodiment of the present application, a material of the coating layer includes an organic silicon compound and an organic fluorine compound.

According to an embodiment of the present application, a thickness of the coating layer in a direction perpendicular to the foldable display module ranges from 3 μm to 10 μm.

According to an embodiment of the present application, the first anti-reflection layer includes a first surface and a second surface opposite to each other in a direction perpendicular to the first anti-reflection layer. The second surface is disposed on a side of the first surface away from the flexible display panel. At least one of the first surface or the second surface is provided with a nano-array structure.

According to an embodiment of the present application, the nano-array structure is a bionic moth-eye structure or a bionic cicada-wing structure.

According to an embodiment of the present application, when the nano-array structure is provided on the second surface, the coating layer covers the nano-array structure. A height of the nano-array structure in a direction perpendicular to the foldable display module is less than a thickness of the coating layer.

According to an embodiment of the present application, a hardness of the first anti-reflection layer ranges from pencil hardness 4B to pencil hardness 2H.

According to an embodiment of the present application, the foldable display module further includes a second anti-reflection layer disposed between the first anti-reflection layer and the flexible display panel.

According to an embodiment of the present application, the foldable display module further includes a cover plate disposed between the first anti-reflection layer and the flexible display panel or disposed on the side of the first anti-reflection layer away from the flexible display panel. The coating layer is formed on a side of the cover plate away from the flexible display panel.

According to an embodiment of the present application, the foldable display module further includes a second anti-reflection layer disposed between the cover plate and the flexible display panel or disposed between the first anti-reflection layer and the cover plate.

According to an embodiment of the present application, the second anti-reflection layer includes a third surface and a fourth surface opposite to each other in a direction perpendicular to the second anti-reflection layer. The fourth surface is disposed on a side of the third surface away from the flexible display panel. At least one of the third surface or the fourth surface is provided with the nano-array structure.

According to an embodiment of the present application, a hardness of the second anti-reflection layer is less than or equal to pencil hardness 6B.

An embodiment of the present application further provides a foldable display device including a foldable display module. The foldable display module includes:

a flexible display panel; and
a first anti-reflection layer disposed on a light-emitting side of the flexible display panel, wherein a side of the first anti-reflection layer away from the flexible display panel is provided with a coating layer with fluoride for increasing water contact angles of a surface the foldable display module.

According to an embodiment of the present application, a material of the coating layer includes an organic silicon compound and an organic fluorine compound.

According to an embodiment of the present application, a thickness of the coating layer in a direction perpendicular to the foldable display module ranges from 3 μm to 10 μm.

According to an embodiment of the present application, the first anti-reflection layer includes a first surface and a second surface opposite to each other in a direction perpendicular to the first anti-reflection layer. The second surface is disposed on a side of the first surface away from the flexible display panel. At least one of the first surface or the second surface is provided with a nano-array structure.

According to an embodiment of the present application, the nano-array structure is a bionic moth-eye structure or a bionic cicada-wing structure.

According to an embodiment of the present application, when the nano-array structure is provided on the second surface, the coating layer covers the nano-array structure. A height of the nano-array structure in a direction perpendicular to the foldable display module is less than a thickness of the coating layer.

According to an embodiment of the present application, a hardness of the first anti-reflection layer ranges from pencil hardness 4B to pencil hardness 2H.

According to an embodiment of the present application, the foldable display module further includes a cover plate disposed between the first anti-reflection layer and the flexible display panel or disposed on the side of the first anti-reflection layer away from the flexible display panel. The coating layer is formed on a side of the cover plate away from the flexible display panel.

According to an embodiment of the present application, the foldable display module further includes a second anti-reflection layer disposed between the cover plate and the flexible display panel or disposed between the first anti-reflection layer and the cover plate.

Beneficial effects of embodiments of the present application are as follows. The present application provides the foldable display module and the foldable display device. The foldable display module includes the flexible display panel and the first anti-reflection layer. The first anti-reflection layer is disposed on the light-emitting side of the flexible display panel. The side of the first anti-reflection layer away from the flexible display panel is provided with the coating layer with fluoride for increasing the water contact angles of the surface the foldable display module. By disposing the first anti-reflection layer on the light-emitting side of the flexible display panel, a light transmittance of the surface of the foldable display module can be increased, and an anti-reflection performance of the foldable display module can also be enhanced. In this way, intensity of light reflected by the surface of the foldable display module can be reduced, and an imaging effect of a crease on the surface of the foldable display module can be reduced, thereby reducing a visual feeling of a human eye on the crease and increasing users' visual experiences. Meanwhile, the coating layer with fluoride disposed on the side of the first anti-reflection layer away from the flexible display panel can increase the water contact angles of the surface of the foldable display module, thereby increasing a hydrophobicity of the surface of the foldable display module and reducing fingerprints attached to the surface of the foldable display module.

DESCRIPTION OF DRAWINGS

In order to describe technical solutions in the present application clearly, drawings to be used in the description of embodiments will be described briefly below. Obviously, drawings described below are only for some embodiments of the present application, and other drawings can be obtained by those skilled in the art based on these drawings without creative efforts.

DETAILED DESCRIPTION OF EMBODIMENTS

Figure 1:
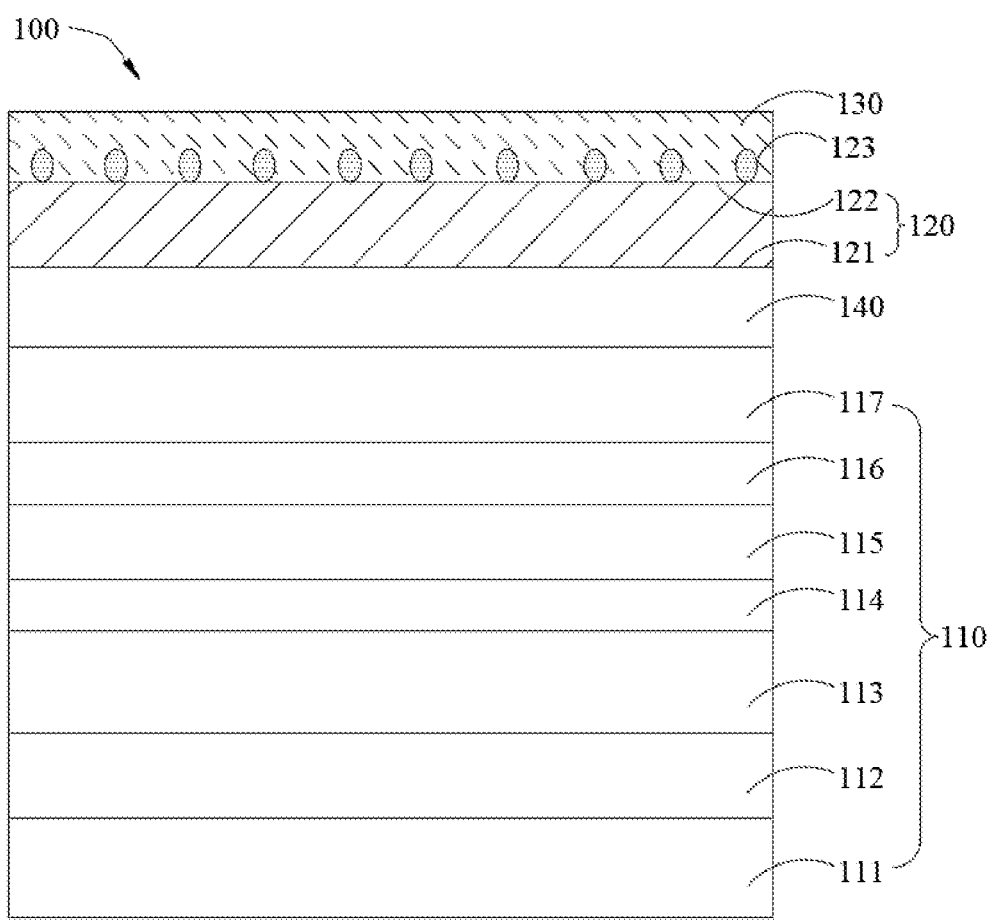
FIG. 1 is a structural schematic diagram of a first foldable display module provided by an embodiment of the present application.

Examples are described below with reference to the appended drawings, and the drawings illustrate particular embodiments in which the present application may be practiced. Directional terms mentioned in the present application, such as upper, lower, front, rear, left, right, in, out, side, etc., only refer to directions in the accompanying drawings. Thus, the adoption of directional terms is used to describe and understand the present application, but not to limit the present application. In the drawings, units of similar structures are using the same numeral to represent.

The present application is further described below in conjunction with drawings and specific embodiments.

As shown in FIGS. 1-5, a purpose of the present application is to provide a foldable display module 100, which includes a flexible display panel 110 and a first anti-reflection layer 120. The first anti-reflection layer 120 is disposed on a light-emitting side of the flexible display panel 110. A side of the first anti-reflection layer 120 away from the flexible display panel 110 is provided with a coating layer 130 with fluoride for increasing water contact angles of a surface of the foldable display module.

By disposing the first anti-reflection layer 120 on the light-emitting side of the flexible display panel 110, a light transmittance of the surface of the foldable display module 100 can be increased, and an anti-reflection performance of the foldable display module 100 can also be enhanced. In this way, intensity of light reflected by the surface of the foldable display module 100 can be reduced. The coating layer 130 with fluoride disposed on the side of the first anti-reflection layer 120 away from the flexible display panel 110 can increase the water contact angles of the surface of the foldable display module 100, thereby increasing a hydrophobicity of the surface of the foldable display module 100 and reducing fingerprints attached to the surface of the foldable display module 100. As result, an imaging effect of a crease on the surface of the foldable display module 100 can be reduced, thereby reducing a visual feeling of a human eye on the crease and increasing users' visual experiences.

In an embodiment, as shown in FIG. 1, FIG. 1 is a schematic structural diagram of a first foldable display module provided by an embodiment of the present application. The foldable display module 100 includes the flexible display panel 110 and the first anti-reflection layer 120. The first anti-reflection layer 120 is disposed on the light-emitting side of the flexible display panel 110. The first anti-reflection layer 120 is attached to the flexible display panel 110 through a first optical adhesive layer 140 positioned between the first anti-reflection layer 120 and the flexible display panel 110.

The flexible display panel 110 includes a support layer 111, a second optical adhesive layer 112, a back plate 113, a third optical adhesive layer 114, a display device layer 115, a fourth optical adhesive layer 116, and a polarizer 117 stacked in sequence. The first anti-reflection layer 120 is attached to the polarizer 117 through the first optical adhesive layer 140.

The display device layer 115 is an organic light-emitting diode display device layer, which includes a pixel driving circuit layer and a plurality of organic light-emitting diodes (not shown) arranged in an array on the pixel driving circuit layer. In an actual implementation, a type of the display device layer 115 can be selected according to requirements, which is not limited to the above-mentioned organic light-emitting diode display device layer and can also be a micro light-emitting diode display device layer or a mini light-emitting diode display device layer.

In an embodiment of the present application, a material of the coating layer 130 includes an organic silicon compound and an organic fluorine compound. A surface energy of molecular groups of the coating layer 130 formed by the organic silicon compound and the organic fluorine compound is —CH2→—CH3→—CF2→C—F2H→—CF3 in descending order. This can increase the water contact angles of the surface of the foldable display module 100 and make the foldable display module 100 have a good anti-fingerprint effect. In an actual implementation, a material and a type of the coating layer 130 can be selected according to requirements and are not limited to the above-mentioned organic silicon compound and organic fluorine compound.

A thickness of the coating layer 130 in a direction perpendicular to the foldable display module 100 ranges from 3 μm to 10 μm.

In an embodiment of the present application, the thickness of the coating layer 130 is 6 μm, which can ensure the anti-fingerprint effect of the coating layer 130 and a protection effect of the first anti-reflection layer 120 without affecting a bending performance of the foldable display module 100. In an actual implementation, the thickness of the coating layer 130 can be selected according to requirements, which is not limited to the above-mentioned thickness of 6 μm and can also be 3 μm, 5 μm, 8 μm, or 10 μm. As long as the thickness of the coating layer 130 ranges from 3 μm to 10 μm, the anti-fingerprint effect, the protection effect, and the bending performance can be balanced.

In an embodiment, the coating layer 130 can be directly formed on the first anti-reflection layer 120 by a coating process. In an actual implementation, the coating layer 130 can also be formed on the first anti-reflection layer 120 by dispensing or attaching.

The first anti-reflection layer 120 includes a first surface 121 and a second surface 122 opposite to each other in a direction perpendicular to the first anti-reflection layer 120. The second surface 122 is disposed on a side of the first surface 121 away from the flexible display panel 110. At least one of the first surface 121 or the second surface 122 is provided with a nano-array structure 123.

Figure 2:
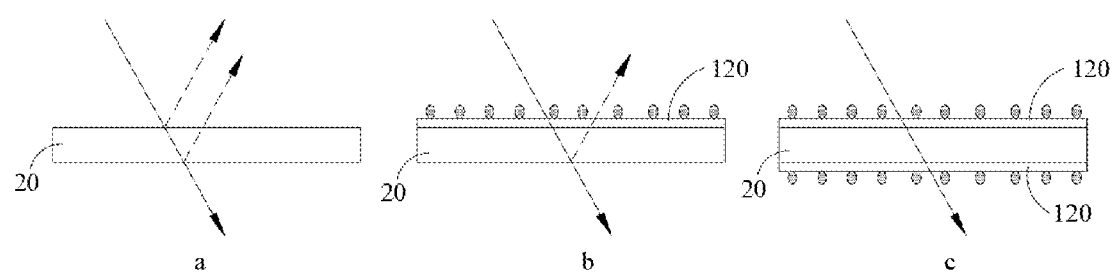
FIG. 2 is a schematic diagram of a principle of anti-reflection films provided by an embodiment of the present application.

As shown in FIG. 2, FIG. 2 is a schematic diagram of a principle of anti-reflection films provided by an embodiment of the present application. FIG. 2a shows an ordinary glass 20 without the first anti-reflection layer 120. When ambient light is incident on an upper surface of the ordinary glass 20 at a certain incidence angle, about 4% of the ambient light is reflected by the upper surface of the ordinary glass 20. When the ambient light emerges from a lower surface of the ordinary glass 20, about 4% of the ambient light is also reflected by the lower surface. As a result, about 92% of the ambient light can penetrate the ordinary glass 20. As shown in FIG. 2b, the upper surface of the ordinary glass 20 is provided with the first anti-reflection layer 120, and a surface of the first anti-reflection layer 120 is provided with the nano-array structure 123 described in the above embodiment. When the ambient light is incident on the upper surface of the ordinary glass 20, there is no reflection, or a very small amount of the ambient light is reflected. When the ambient light emerges from the lower surface of the ordinary glass 20, about 4% of the ambient light is reflected by the lower surface. As a result, about 96% of the ambient light can penetrate the ordinary glass 20. As shown in FIG. 2c, both the upper surface and the lower surface of the ordinary glass 20 are provided with the first anti-reflection layer 120. When the ambient light is incident on the upper surface and emerges from the lower surface, there is no reflection, or a very small amount of the ambient light is reflected. As a result, about 100% of the ambient light can penetrate the ordinary glass 20. It can be known that because the first anti-reflection layer 120 having the nano-array structure 123 is disposed on at least one of the upper surface or the lower surface of the ordinary glass 20, intensity of light reflected by the surface of the ordinary glass 20 can be reduced, and a light transmittance of the surface of ordinary glass 20 can be further increased.

In an embodiment, as shown in FIG. 1, the nano-array structure 123 is provided on the second surface 122 of the first anti-reflection layer 120.

Please refer to FIG. 1, the nano-array structure 123 is composed of a plurality of nano-protrusions arranged in an array on the second surface 122. Tops of the plurality of nano-protrusions face a side of the second surface 122 away from the flexible display panel 110. A size of each of the nano-protrusions gradually increases from a top to a bottom of each of the nano-protrusions, so that a refractive index of the second surface 122 of the first anti-reflection layer 120 can continuously change along a thickness direction of the first anti-reflection layer 120. Accordingly, a reflection effect caused by a sharp change of a refractive index at an interface (i.e., second surface 122) between an external environment and the first anti-reflection layer 120 can be reduced. Therefore, the second surface 122 of the first anti-reflection layer 120 has a lower reflection coefficient for visible light, thereby enhancing an anti-reflection performance of the surface of the foldable display module 100 and increasing the light transmittance of the surface of the foldable display module 100. In this way, the intensity of the light reflected by the surface of the foldable display module 100 is reduced, so that an amount of light transmitted or entering the surface of the foldable display module 100 is maximized. As result, the imaging effect of the crease on the surface of the foldable display module 100 can be reduced, thereby reducing the visual feeling of the human eye on the crease and increasing the users' visual experiences.

Furthermore, when the nano-array structure 123 is provided on the second surface 122, the coating layer 130 covers the nano-array structure 123. A height of the nano-array structure 123 in the direction perpendicular to the foldable display module 100 is less than the thickness of the coating layer 130. In this way, the nano-array structure 123 on the second surface 122 can be protected to prevent a reflection reduction effect of the first anti-reflection layer 120 from being weakened due to abrasion of the nano-array structure 123 during operation.

In an embodiment, the nano-protrusions in the nano-array structure 123 are evenly distributed on the second surface 122 of the first anti-reflection layer 120. In this way, the intensity of the light reflected by an entire surface of the foldable display module 100 can be reduced, and a visual effect of the crease can be reduced.

In an embodiment, the nano-array structure 123 is a bionic moth-eye structure. In an actual implementation, a type of nano-array structure 123 can be selected according to requirements, which is not limited to the above-mentioned bionic moth-eye structure and can also be other bionic structures that can reduce reflectivity such as a bionic cicada-wing structure with reduced reflectivity.

In an embodiment, both the first surface 121 and the second surface 122 of the first anti-reflection layer 120 are provided with the nano-array structure 123. The tops of the nano-protrusions of the nano-array structure 123 disposed on the first surface 121 are configured to face the flexible display panel 110, so that a refractive index of the first surface 121 of the first anti-reflection layer 120 can continuously change along the thickness direction of the first anti-reflection layer 120. Accordingly, a reflection effect caused by a sharp change of a refractive index at an interface (i.e., first surface 121) between the first anti-reflection layer 120 and the first optical adhesive layer 140 can be reduced. Therefore, on a basis of the above-mentioned embodiment, a reflection coefficient of the first anti-reflection layer 120 relative to the ambient light is further reduced, and the intensity of the light reflected by the surface of the foldable display module 100 is reduced. As a result, the imaging effect of the crease on the surface of the foldable display module 100 can be reduced, thereby reducing the visual feeling of the human eye on the crease.

In an embodiment, the first surface 121 of the first anti-reflection layer 120 is provided with the nano-array structure 123, and the second surface 122 of the first anti-reflection layer 120 is not provided with the nano-array structure 123. In this way, a same or similar anti-reflection effect as the above-mentioned embodiment can also be obtained, and the intensity of the light reflected by the entire surface of the foldable display module 100 can be reduced, and the visual effect of the crease can be reduced.

In an embodiment, referring to FIG. 1, the first anti-reflection layer 120 can replace a cover plate of the current foldable display module, which can simplify a film structure of the foldable display module 100 and increase a bending resistance of the foldable display module 100. In order to realize the above structure, a hardness of the first anti-reflection layer 120 in an embodiment of the present application is pencil hardness 2B, so that the bending performance and hardness of the first anti-reflection layer 120 and the foldable display module 100 can be balanced. In an actual implementation, the hardness of the first anti-reflection layer 120 can be selected according to requirements, which is not limited to the above-mentioned pencil hardness 2B and can also be pencil hardness 4B, 3B, B, HB, F, HB, or 2H.

The foldable display module 100 further includes a cover plate 150. The cover plate 150 is disposed between the first anti-reflection layer 120 and the flexible display panel 110, or the cover plate 150 is disposed on the side of the first anti-reflection layer 120 away from the flexible display panel 110. The coating layer 130 is formed on a side of the cover plate 150 away from the flexible display panel 110.

Figure 3:
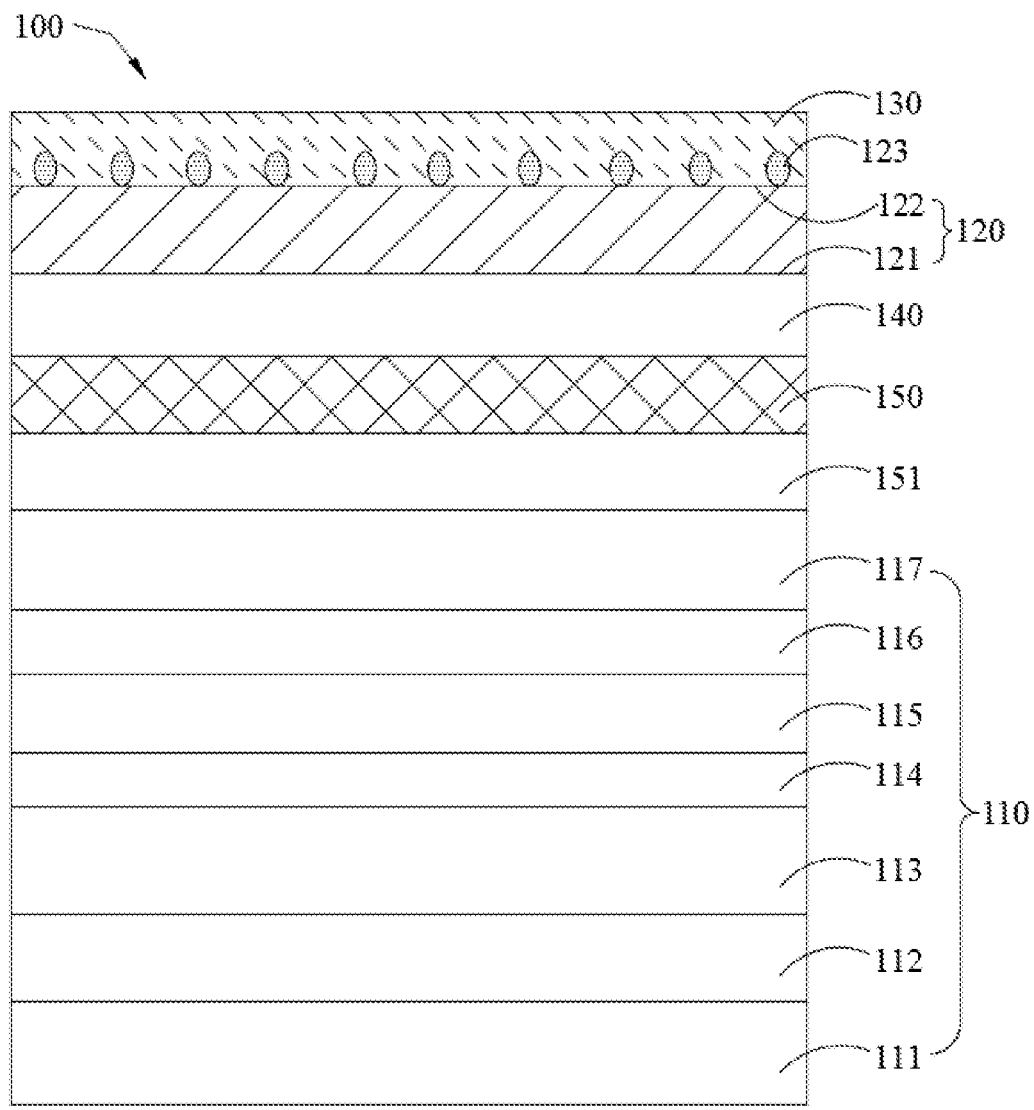
FIG. 3 is a structural schematic diagram of a second foldable display module provided by an embodiment of the present application.

In an embodiment, as shown in FIG. 3, FIG. 3 is a schematic structural diagram of a second foldable display module provided by an embodiment of the present application. A structure of the second foldable display module shown in FIG. 3 is generally same as the structure of the first foldable display module shown in FIG. 1, and a difference is that the foldable display module 100 shown in FIG. 3 further includes the cover plate 150. The cover plate 150 is disposed on the light-emitting side of the flexible display panel 110. The first anti-reflection layer 120 is disposed on the side of the cover plate 150 away from the flexible display panel 110. The cover plate 150 is attached to the polarizer 117 through a fifth optical adhesive layer 151. The first anti-reflection layer 120 is attached to the cover plate 150 through the first optical adhesive layer 140.

In an embodiment, the first anti-reflection layer 120 is disposed between the cover plate 150 and the flexible display panel 110. The first anti-reflection layer 120 is attached to the flexible display panel 110 through the first optical adhesive layer 140. The cover plate 150 is attached to the first anti-reflection layer 120 through the fifth optical adhesive layer 151. The coating layer 130 is formed on a surface of the light-emitting side of the cover plate 150. The hardness of the first anti-reflection layer 120 should be less than or equal to pencil hardness 6B. In this way, while ensuring the bending performance of the foldable display module 100, the first anti-reflection layer 120 can also be configured to reduce the intensity of the light reflected by the entire surface of the foldable display module 100 and reduce the imaging effect of the crease on the surface of the foldable display module 100. Meanwhile, the coating layer 130 can be configured to increase the water contact angles of the surface of the foldable display module 100 to increase the hydrophobicity of the surface of the foldable display module 100 and reduce the fingerprints attached to the surface of the foldable display module 100.

The foldable display module 100 further includes the second anti-reflection layer 160. When the foldable display module 100 is not provided with the cover plate 150, the second anti-reflection layer 160 is disposed between the first anti-reflection layer 120 and the flexible display panel 110. When the foldable display module 100 is provided with the cover plate 150, the second anti-reflection layer 160 is disposed between the cover plate 150 and the flexible display panel 110, or the second anti-reflection layer 160 is disposed between the first anti-reflection layer 120 and the cover plate 150.

Figure 4:
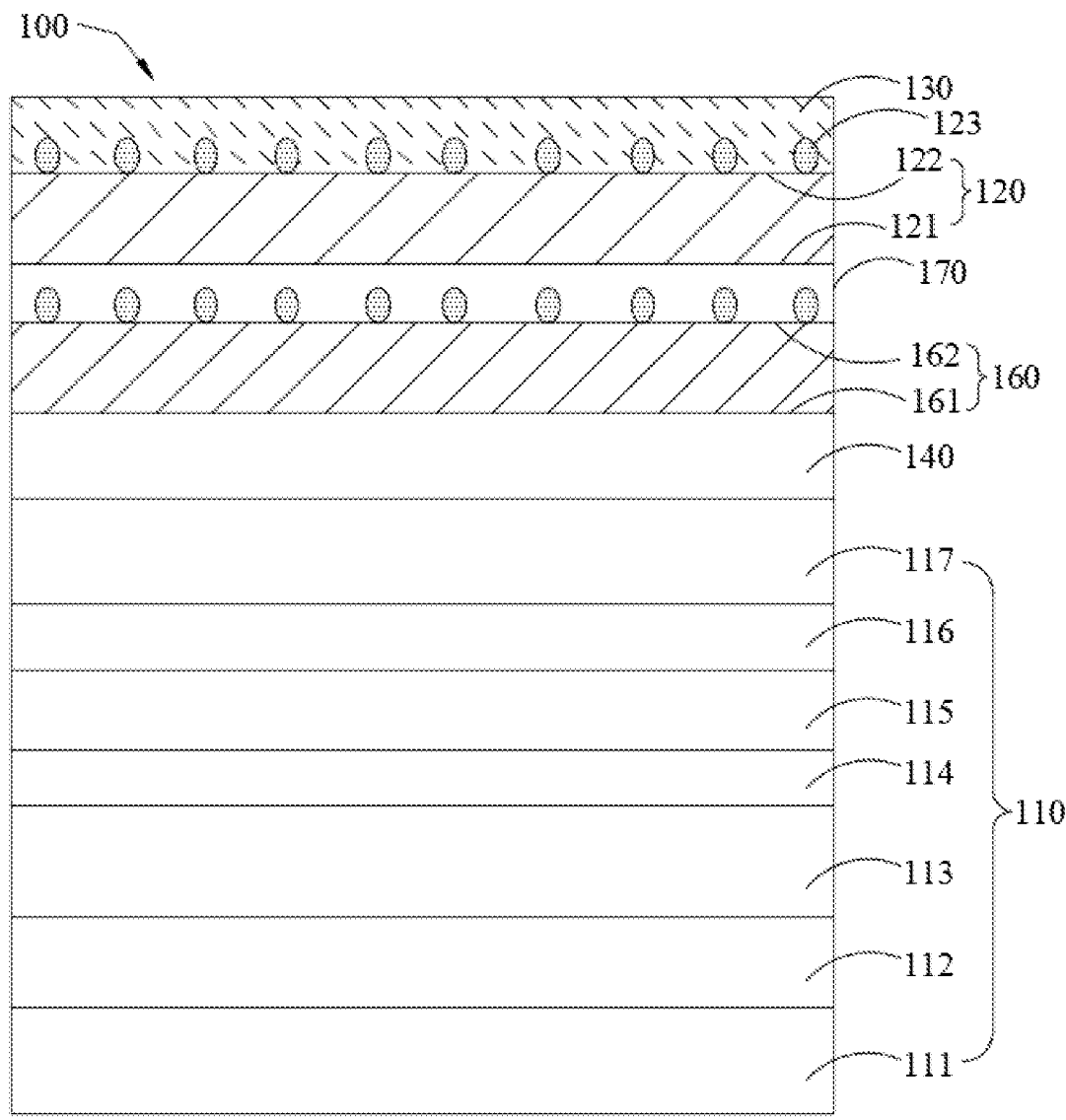
FIG. 4 is a structural schematic diagram of a third foldable display module provided by an embodiment of the present application.

In an embodiment, as shown in FIG. 4, FIG. 4 is a schematic structural diagram of a third foldable display module provided by an embodiment of the present application. The foldable display module 100 includes the first anti-reflection layer 120 and the second anti-reflection layer 160 stacked on the light-emitting side of the flexible display panel 110. The second anti-reflection layer 160 is disposed between the first anti-reflection layer 120 and the flexible display panel 110. The first anti-reflection layer 120 is attached to the second anti-reflection layer 160 through a sixth optical adhesive layer 170. The second anti-reflection layer 160 is attached to the polarizer 117 through the first optical adhesive layer 140.

Structures of the first anti-reflection layer 120 and the second anti-reflection layer 160 of the third foldable display module 100 shown in FIG. 4 are generally same as the structures of the first anti-reflection layer 120 of the first foldable display module 100 shown in FIGS. 1 and 3. The first anti-reflection layer 120 also includes the first surface 121 and the second surface 122 opposite to each other in the thickness direction of the first anti-reflection layer 120. At least one of the first surface 121 or the second surface 122 is provided with the nano-array structure. The second anti-reflection layer 160 includes the third surface 161 and a fourth surface 162 opposite to each other in a direction perpendicular to the second anti-reflection layer 160. The fourth surface 162 is disposed on a side of the third surface 161 away from the flexible display panel 110. The fourth surface 162 is also provided with the nano-array structure. This nano-array structure is generally same as the nano-array structure on the first anti-reflection layer 120, which is not repeatedly described herein.

In an actual implementation, the nano-array structure is not limited to being disposed on the fourth surface 162 of the second anti-reflection layer 160. The nano-array structure can also be only disposed on the third surface 161, or the nano-array structure can be disposed on the third surface 161 and the fourth surface 162 at a same time. To a certain extent, this further reduces the intensity of the light reflected by the foldable display module 100 and reduces the imaging effect of the crease on the surface of the foldable display module 100.

The third foldable display module 100 shown in FIG. 4 adopts a structure of two layers of the first anti-reflection layer 120 and the second anti-reflection layer 160 stacked on top of each other, which is beneficial to further reduce the intensity of the light reflected by the surface of the foldable display module 100. Furthermore, when the nano-array structure 123 on the second surface 122 of the first anti-reflection layer 120 is damaged, the nano-array structure on the first surface of the first anti-reflection layer 120 and the nano-array structure on the second anti-reflection layer 160 can play a role in reducing reflection.

Figure 5:
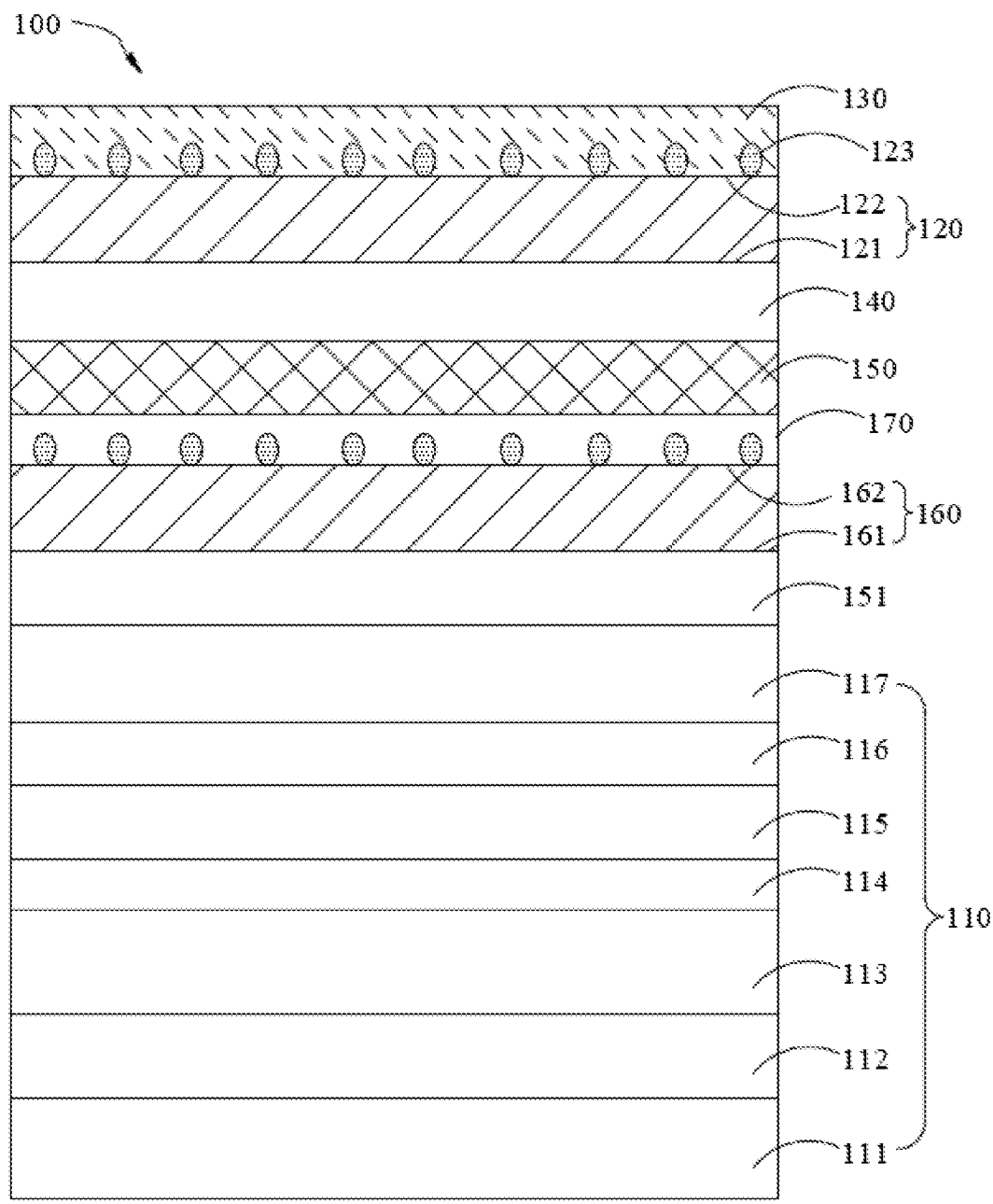
FIG. 5 is a structural schematic diagram of a fourth foldable display module provided by an embodiment of the present application.

In an embodiment, as shown in FIG. 5, FIG. 5 is a schematic structural diagram of a fourth foldable display module provided by an embodiment of the present application. A structure of the fourth foldable display module shown in FIG. 5 is generally same as the structure of the second foldable display module shown in FIG. 3, and a difference is that the foldable display module 100 shown in FIG. 5 further includes second anti-reflection layer 160. The second anti-reflection layer 160 is disposed between the cover plate 150 and the flexible display panel 110. The cover plate 150 is attached to the second anti-reflection layer 160 through the sixth optical adhesive layer 170. The second anti-reflection layer 160 is attached to the flexible display panel 110 through the fifth optical adhesive layer 151.

In an actual implementation, the second anti-reflection layer 160 is not limited to being disposed between the cover plate 150 and the flexible display panel 110 and can also be disposed between the first anti-reflection layer 120 and the cover plate 150. This can also obtain same or similar technical effects as the above-mentioned embodiments, which is not repeatedly described herein.

Furthermore, a hardness of the second anti-reflection layer 160 is pencil hardness 6B, so that the second anti-reflection layer 160 has a good bending performance. In an actual implementation, the hardness of the second anti-reflection layer 160 can be selected according to requirements, which is not limited to the above-mentioned pencil hardness 6B, can also be pencil hardness 7B or 8B, etc., and only needs to be less than or equal to pencil hardness of 6B.

An embodiment of the present application further provides a foldable display device, and the foldable display device includes the foldable display module and a housing, a camera module, and a power supply module fixedly assembled with the foldable display module that can make the foldable display module be in a folded or unfolded state. The foldable display module in the embodiment of the present application can be the foldable display module 100 provided in the above-mentioned embodiment. In addition, the foldable display module in an embodiment of the present application can achieve same or similar technical effects as the foldable display module 100 provided in the above-mentioned embodiments, which is not repeatedly described herein.

The present application provides the foldable display module and the foldable display device. The foldable display module includes the flexible display panel and at least one layer of anti-reflection films. The anti-reflection film is disposed on the light-emitting side of the flexible display panel. The anti-reflection film is provided with the first surface and the second surface opposite to each other in the thickness direction of the anti-reflection film. The second surface is disposed on the side of the first surface away from the flexible display panel. At least one of the first surface or the second surface is provided with the nano-array structure. The nano-array structure disposed on a surface of one of the anti-reflection films can increase the light transmittance of the surface of the foldable display module and enhance the anti-reflection performance of the foldable display module. In this way, the intensity of the light reflected by the surface of the foldable display module can be reduced, and the imaging effect of the crease on the surface of the foldable display module can be reduced, thereby reducing the visual feeling of the human eye on the crease and increasing the users' visual experiences.

Although the present application has been disclosed above with the preferred embodiments, it is not intended to limit the present application. Persons having ordinary skill in this technical field can still make various alterations and modifications without departing from the scope and spirit of the present application. Therefore, the scope of the present application should be defined and protected by the following claims and their equivalents.

What is claimed is:

1. A foldable display module, comprising:
   a flexible display panel; and
   a first anti-reflection layer disposed on a light-emitting side of the flexible display panel, wherein a side of the first anti-reflection layer away from the flexible display panel is provided with a coating layer with fluoride for increasing water contact angles of a surface of the foldable display module;
   wherein the first anti-reflection layer comprises a first surface and a second surface opposite to each other in a direction perpendicular to the first anti-reflection layer, the second surface is disposed on a side of the first surface away from the flexible display panel, and at least one of the first surface or the second surface is provided with a nano-array structure; the foldable display module further comprises a cover plate disposed between the first anti-reflection layer and the flexible display panel or disposed on the side of the first anti-reflection layer away from the flexible display panel, wherein the coating layer is formed on a side of the cover plate away from the flexible display panel.

2. The foldable display module according to claim 1, wherein a material of the coating layer comprises an organic silicon compound and an organic fluorine compound.

3. The foldable display module according to claim 2, wherein a thickness of the coating layer in a direction perpendicular to the foldable display module ranges from 3 µm to 10 µm.

4. The foldable display module according to claim 1, wherein the nano-array structure is a bionic moth-eye structure or a bionic cicada-wing structure.

5. The foldable display module according to claim 1, wherein when the nano-array structure is provided on the second surface, the coating layer covers the nano-array structure, and a height of the nano-array structure in a direction perpendicular to the foldable display module is less than a thickness of the coating layer.

6. The foldable display module according to claim 1, wherein a hardness of the first anti-reflection layer ranges from pencil hardness 4B to pencil hardness 2H.

7. The foldable display module according to claim 1, further comprising a second anti-reflection layer disposed between the first anti-reflection layer and the flexible display panel.

8. The foldable display module according to claim 1, further comprising a second anti-reflection layer disposed between the cover plate and the flexible display panel or disposed between the first anti-reflection layer and the cover plate.

9. The foldable display module according to claim 8, wherein the second anti-reflection layer comprises a third surface and a fourth surface opposite to each other in a direction perpendicular to the second anti-reflection layer, the fourth surface is disposed on a side of the third surface away from the flexible display panel, and at least one of the third surface or the fourth surface is provided with the nano-array structure.

10. The foldable display module according to claim 8, wherein a hardness of the second anti-reflection layer is less than or equal to pencil hardness 6B.

11. The foldable display module according to claim 1, wherein the nano-array structure comprises a plurality of nano-protrusions arranged in array, and a size of each of the plurality of nano-protrusions gradually increases from a top to a bottom of the nano-protrusion.

12. A foldable display device, comprising a foldable display module, wherein the foldable display module comprises:
a flexible display panel; and
a first anti-reflection layer disposed on a light-emitting side of the flexible display panel, wherein a side of the first anti-reflection layer away from the flexible display panel is provided with a coating layer with fluoride for increasing water contact angles of a surface of the foldable display module;
wherein the first anti-reflection layer comprises a first surface and a second surface opposite to each other in a direction perpendicular to the first anti-reflection layer, the second surface is disposed on a side of the first surface away from the flexible display panel, and at least one of the first surface or the second surface is provided with a nano-array structure; the foldable display module further comprises a cover plate disposed between the first anti-reflection layer and the flexible display panel or disposed on the side of the first anti-reflection layer away from the flexible display panel, and the coating layer is formed on a side of the cover plate away from the flexible display panel.

13. The foldable display device according to claim 12, wherein a material of the coating layer comprises an organic silicon compound and an organic fluorine compound.

14. The foldable display device according to claim 13, wherein a thickness of the coating layer in a direction perpendicular to the foldable display module ranges from 3 µm to 10 µm.

15. The foldable display device according to claim 12, wherein the nano-array structure is a bionic moth-eye structure or a bionic cicada-wing structure.

16. The foldable display device according to claim 12, wherein a hardness of the first anti-reflection layer ranges from pencil hardness 4B to pencil hardness 2H.

17. The foldable display device according to claim 12, wherein the nano-array structure comprises a plurality of nano-protrusions arranged in array, and a size of each of the plurality of nano-protrusions gradually increases from a top to a bottom of the nano-protrusion.

18. A foldable display device comprising a foldable display module, wherein the foldable display module comprises:
a flexible display panel; and
a first anti-reflection layer disposed on a light-emitting side of the flexible display panel, wherein a side of the first anti-reflection layer away from the flexible display panel is provided with a coating layer with fluoride for increasing water contact angles of a surface of the foldable display module;
wherein the first anti-reflection layer comprises a first surface and a second surface opposite to each other in a direction perpendicular to the first anti-reflection layer, the second surface is disposed on a side of the first surface away from the flexible display panel, and at least one of the first surface or the second surface is provided with a nano-array structure,
wherein when the nano-array structure is provided on the second surface, the coating layer covers the nano-array structure, and a height of the nano-array structure in a direction perpendicular to the foldable display module is less than a thickness of the coating layer.

* * * * *